United States Patent
Glatkowski et al.

(10) Patent No.: US 8,632,699 B2
(45) Date of Patent: Jan. 21, 2014

(54) FUGITIVE VISCOSITY AND STABILITY MODIFIERS FOR CARBON NANOTUBE COMPOSITIONS

(75) Inventors: Paul J. Glatkowski, Littletown, MA (US); Joseph W. Piche, Raynham, MA (US); C. Michael Trottier, Saunderstown, RI (US); Philip Wallis, Barrington, RI (US); David J. Arthur, Norwood, MA (US); Jiazhong Luo, Acton, MA (US)

(73) Assignee: Eikos, Inc., Franklin, MA (US)

( * ) Notice: Subject to any disclaimer, the term of this patent is extended or adjusted under 35 U.S.C. 154(b) by 1224 days.

(21) Appl. No.: 11/547,903

(22) PCT Filed: Apr. 7, 2005

(86) PCT No.: PCT/US2005/011657
§ 371 (c)(1),
(2), (4) Date: Oct. 1, 2007

(87) PCT Pub. No.: WO2006/073420
PCT Pub. Date: Jul. 13, 2006

(65) Prior Publication Data
US 2008/0135815 A1   Jun. 12, 2008

Related U.S. Application Data

(60) Provisional application No. 60/560,019, filed on Apr. 7, 2004.

(51) Int. Cl.
*H01B 1/24* (2006.01)
*H01B 1/18* (2006.01)

(52) U.S. Cl.
USPC ............................ 252/510; 252/511; 252/502

(58) Field of Classification Search
USPC .......................................... 252/510, 511, 502
See application file for complete search history.

(56) References Cited

U.S. PATENT DOCUMENTS

| | | | |
|---|---|---|---|
| 5,424,054 A | 6/1995 | Bethune et al. | |
| 5,853,877 A | 12/1998 | Shibuta | |
| 6,221,330 B1 | 4/2001 | Moy et al. | |
| 6,265,466 B1 | 7/2001 | Glatkowski et al. | |
| 6,333,016 B1 | 12/2001 | Resasco et al. | |
| 6,682,677 B2 | 1/2004 | Lobovsky et al. | |
| 7,060,241 B2 * | 6/2006 | Glatkowski | 423/447.1 |
| 2002/0035170 A1 * | 3/2002 | Glatkowski et al. | 523/137 |
| 2002/0113335 A1 * | 8/2002 | Lobovsky et al. | 264/184 |
| 2003/0122111 A1 * | 7/2003 | Glatkowski | 252/500 |
| 2003/0180472 A1 | 9/2003 | Zhou et al. | |
| 2004/0071949 A1 * | 4/2004 | Glatkowski et al. | 428/313.3 |
| 2005/0209392 A1 * | 9/2005 | Luo et al. | 524/496 |
| 2007/0120100 A1 * | 5/2007 | Glatkowski et al. | 252/502 |
| 2008/0292887 A1 * | 11/2008 | Kim et al. | 428/426 |

FOREIGN PATENT DOCUMENTS

| WO | WO 01/92381 | 12/2001 |
|---|---|---|
| WO | WO 02076724 A1 * | 10/2002 |
| WO | WO 03013199 A2 * | 2/2003 |

* cited by examiner

*Primary Examiner* — Douglas Mc Ginty
(74) *Attorney, Agent, or Firm* — Milstein Zhang & Wu LLC; Joseph B. Milstein (57) ABSTRACT

The invention is directed to carbon nanotube-containing compositions that have increased viscosity and stability. In particular, the invention is directed to methods for manufacturing carbon nanotube films and layers that provide superior electrical properties.

10 Claims, 5 Drawing Sheets

FUGITIVE VISCOSITY AND STABILITY MODIFIERS FOR CARBON NANOTUBE COMPOSITIONS

REFERENCE TO RELATED APPLICATIONS

This invention claims priority to U.S. Provisional Application No. 60/560,019 entitled "Increased Viscosity and Stability of Carbon Nanotube Ink" filed Apr. 7, 2004, the entirety of which is hereby incorporated by reference.

BACKGROUND

1. Field of the Invention

The invention is directed to carbon nanotube-containing compositions that have increased viscosity and stability. In particular, the invention is directed to methods for manufacturing carbon nanotube films and layers that provide superior electrical properties.

2. Description of the Background

Carbon nanotubes are the most recent addition to the growing members of the carbon family of molecular structures. Carbon nanotubes can be viewed as a graphite sheet rolled up into a nanoscale tube form to produce the so-called single-wall carbon nanotubes (SWNT) Harris, P. F. "Carbon Nanotubes and Related Structures: New Materials for the Twenty-first Century", Cambridge University Press: Cambridge, 1999. There may be additional graphene tubes around the core of a SWNT to form multi-wall carbon nanotubes (MWNT). These elongated nanotubes have a diameter in the range from few angstroms to tens of nanometers and a length of several micrometers up to millimeters. Both ends of the tubes may be capped with fullerene-like structures such as pentagons.

Carbon nanotubes comprises straight and/or bent multi-walled nanotubes (MWNT), straight and/or bent double-walled nanotubes (DWNT), or straight and/or bent single-walled nanotubes (SWNT), and combinations and mixtures thereof. CNT may also include various compositions of these nanotube forms and common by-products contained in nanotube preparations such as described in U.S. Pat. No. 6,333,016 and WO 01/92381. Carbon nanotubes may also be modified chemically to incorporate chemical agents or compounds, or physically to create effective and useful molecular orientations (see U.S. Pat. No. 6,265,466), or to adjust the physical structure of the nanotubes.

SWNTs can be formed by a number of techniques, such as laser ablation of a carbon target, decomposing a hydrocarbon, and setting up an arc between two graphite electrodes. For example, U.S. Pat. No. 5,424,054 to Bethune et al. describes a process for producing single-walled carbon nanotubes by contacting carbon vapor with cobalt catalyst. Carbon vapor is produced by electric arc heating of solid carbon, which can be amorphous carbon, graphite, activated or decolorizing carbon or mixtures thereof. Other techniques of carbon heating are discussed, such as laser heating, electron beam heating and RF induction heating. Smalley (Guo, T., Nikolaev, P., Thess, A., Colbert, D. T., and Smally, R. E., Chem. Phys. Lett. 243: 1-12 (1995)) describes a method of producing single-walled carbon nanotubes, wherein graphite rods and a transition metal are simultaneously vaporized by a high-temperature laser. Smalley (Thess, A., Lee, R., Nikolaev, P., Dai, H., Petit, P., Robert, J., Xu, C., Lee, Y. H., Kim, S. G., Rinzler, A. G., Colbert, D. T., Scuseria, G. E., Tonarek, D., Fischer, J. E., and Smalley, R. E., Science, 273: 483-487 (1996)) also describes a process for production of single-walled carbon nanotubes in which a graphite rod containing a small amount of transition metal is laser vaporized in an oven at about 1,200° C. Single-wall nanotubes were reported to be produced in yields of more than 70%. U.S. Pat. No. 6,221,330 discloses methods of producing single-walled carbon nanotubes which employs gaseous carbon feedstocks and unsupported catalysts.

Carbon nanotubes have many well known applications (R. Saito, G. Dresselhaus, M. S. Dresselhaus, "Physical Properties of Carbon Nanotubes," Imperial College Press, London U.K. 1998, or A. Zettl "Non-Carbon Nanotubes" Advanced Materials, 8, p. 443, 1996). Carbon nanotubes can exhibit semiconducting or metallic behavior (Dai, L.; Mau, A. W. M. Adv. Mater. 2001, 13, 899). They also possess a high surface area (400 m2/g for nanotube "paper") (Niu, C.; Sichel, E. K.; Hoch, R.; Moy, D.; Tennent, H. "High power electrochemical capacitors based on carbon nanotube electrodes", Appl. Phys. Lett. 1997, 70, 1480-1482), high electrical conductivity (5000 S/cm) (Dresselhaus, M. Phys. World 1996, 9, 18), high thermal conductivity (6000 W/mK) and stability (stable up to 2800° C. in vacuum) (Collins, P. G.; Avouris, P. "Nanotubes for electronics", Sci. Am. 2000, Dec. 62-69) and good mechanical properties (tensile strength 45 billion pascals).

Films made of carbon nanotubes are known to have surface resistances as low as 102 ohms/square. U.S. Pat. No. 5,853,877, entitled "Method for Disentangling Hollow Carbon Microfibers, Electrically Conductive Transparent Carbon Microfibers Aggregation Film and Coating for Forming Such Film," describes formation of conductive carbon nanotube films. U.S. Pat. No. 6,221,330, entitled "Processing for Producing Single Wall Nanotubes Using Unsupported Metal Catalysts," generally describes production of carbon nanotubes for forming conductive films. However, there has been no report in the art on a method for patterning carbon nanotube-containing films.

Coatings comprising carbon nanotubes, such as carbon nanotube-containing films, have been previously described (see U.S. patent application Ser. No. 10/105,623). Such films may have a surface resistance as low as $10^2$ ohms/square and a total light transmittance as high as 95%. The content of carbon nanotubes in these films may be as high as 50%. Carbon nanotubes may also be deposited on a transparent plastic film to form a transparent conductive coating.

Carbon nanotubes deposited on a surface as a thin coating or film can function as electrical conductors or electrodes, catalytic sites, sensors to detect chemicals, energy, motion or contact (as in touch screens); and other functions which exploit the unique properties of this new form of carbon material. However, to utilize thin coating of nanotubes in most applications, the coating of nanotubes is formed as patterns or circuits defining an active area of nanotubes and separating that area from one or more inactive areas.

For a coating of nanotubes to function as an electrode in a resistive-type touch screen, the electrode must be patterned on an electrically insulating substrate. For example, a polymer film such as polyethylene terephthalate PET, can define parts of the nanotube coating that forms an electrically conductive circuit and switch. That coating then responds to the operator's touch when pressed against a second electrode.

Most commercially produced, transparent electrodes are made from metal or metal oxide coatings applied to an optically transparent substrate by, for example, vacuum deposition, chemical vapor deposition, chemical bath deposition, sputtering, evaporation, pulsed vapor deposition, sol-gel methods, electroplating or spray pyrolysis. If desired, these coatings can be patterned with costly photolithographic techniques. This process is difficult and expensive. Scaling up production to cover large areas with electrodes can be almost prohibitively. Further, because coatings are based on a rigid metal oxide, flexible applications which would otherwise be possible with substrates of plastic displays, plastic solar voltaic and wearable electrical circuitry are also not possible.

Carbon Nanotube (CNT) dispersions in water or other common solvents are thermodynamically unstable, meaning they have a high propensity to self assemble into rope structures. Over time, these ropes can increase in diameter or flocculate, ultimately leading to a de-stabilized dispersion, which is undesirable for coating forming uniform thin coatings of CNT on a surface. To form electrically conductive coatings, it is desirable to maintain the CNT particles as small diameter ropes (less than about 30 nm) in the dispersion until a film is formed on the surface and solvent removed. Once the wet film is formed on a surface, it is desirable to encourage the self assembly of the ropes and thereby form a conductive network of ropes on the surface by removing all other materials. But, if the ropes grow in size or assembly by flocculation of ropes in the coating solution, i.e. before the film is formed, then further assembly of the film is compromised and the resulting dry coating exhibits lower surface resistivity at a given mass deposition per unit area. Furthermore, dispersions of small particles and CNT are typically formed from solvents and dispersing aids like surfactants or other additives like polymers. However the additives will also be deposited in the coating as the solvent evaporate and will interfere with formation of the conductive network. This results in sub-optimal electronic performance for the thin film.

Without the use of surfactants or other additives aside from the solvent carrier, CNT dispersions have been found to be kinetically "stable" both at very low concentrations (less than about 100 mg/liter), and at high concentrations (greater than about 3,000 mg/liter). The low concentration range has the viscosity of the liquid phase (typically about 1 cP) largely due to the solvent, such as water or alcohol. The high concentration range has the viscosity of a "paste" or "gel". At both ends of the concentration spectrum, the CNT dispersions have useful shelf life (greater than about 8 hours) without need for additives such as surfactant or viscosity modifiers.

The low concentration range is suitable for the spray coating of transparent (and non-transparent) conductive films over a broad range of sheet resistance (typically 10 to $10^9$ ohm/square). The low concentration range is also suitable for various continuous web coating techniques (e.g., gravure, Meyer rod, reverse roll, etc.), but the sheet resistance range is limited to higher sheet resistance values (greater than about $10^4$ ohm/square). The latter limitation is due to practical limits on wet coating thickness for low viscosity coating formulations (typically less than about 50 microns) which being very dilute require a relatively thick wet coating to deposit sufficient material on the surface in a single or multiple applications.

The high concentration range is suitable for various continuous web coating techniques (e.g., gravure, Meyer rod, reverse roll, etc.), but this concentration is too high to allow for higher sheet resistance values (greater than about $10^2$ ohm/square) and results in coating with inferior electrical and optical properties compared to those coating made from deposition of the same amount of CNT per unit area from solutions in the low concentration range.

Thus, a need exists for a coating formulation capability that allows for the preparation of dispersions of CNT over the full concentration range (10 to 3,000 mg/liter or so) with useful stability to allow deposition by traditional coating processes.

SUMMARY OF THE INVENTION

The invention is broadly directed to compositions of carbon nanotubes that can be formed into a layers and films that have superior electrical performances over a wide range of concentrations, and in particular to method for their manufacture.

One embodiment of the invention is directed to stable dispersions comprising carbon nanotubes uniformly distributed within a solvent, wherein said carbon nanotubes do not flocculate within a period of time of greater than 12 hours. Preferably, concentrations of carbon nanotubes in the dispersion is between 10 mg/L and 3,000 mg/L, and contain a fugitive viscosity modifier that increases or decreases viscosity of the dispersion.

Preferred fugitive viscosity modifier include, but are not limited to, water-soluble gums, xanthan, polyacrylics, polyethylene oxide, silica, methyl cellulose, photosensitive acrylics, polyurethane additives, polyvinyl alcohol, gelatin, and combinations thereof. Also preferred, the fugitive viscosity modifier increases viscosity of the dispersion and can be entirely or nearly entirely removed at a temperature that does not adversely affect molecular structure of the carbon nanotubes.

Another embodiment of the invention is directed to methods of forming an electrically conductive network of carbon nanotubes comprising applying a solution containing carbon nanotubes in a solvent and a fugitive viscosity modifier to a surface; and removing the solvent and forming an electrically conductive network of carbon nanotubes. Preferably, removing the solvent also removes the fugitive viscosity modifier. Preferred methods for removing solvent include, but are not limited to, thermal decomposition, evaporation, sublimation, decomposition, ablation or washing out with the same or another solvent. Also preferred, removal or the solvent and the fugitive viscosity modifier does not affect a molecular structure of the carbon nanotubes. Also preferred, the fugitive viscosity modifiers aids in dispersion of carbon nanotubes in the solvent during deposition and drying to a substrate.

Other embodiments and advantages of the invention are set forth in part in the description, which follows, and in part, may be obvious from this description, or may be learned from the practice of the invention.

DESCRIPTION OF THE INVENTION

The poor stability of conventional CNT dispersions in the intermediate concentration range presents a significant challenge and also opportunity. Additionally, creation of CNT coating from low concentration CNT dispersions requires deposition of very thick layers of the dispersion onto the substrate. At low viscosity, such layers are difficult to control during drying and other post deposition steps. The inclusion of fugitive viscosity modifiers in the composition allows for a wide range of CNT concentrations in the dispersion to be coated and processed into films.

The invention involves stabilizing CNT compositions, such as dispersions, by constraining the mobility of CNT particles for a period of time sufficient to allow handling of the dispersion, deposition of the dispersion as a wet coating, and drying of the wet coating. This can be achieved by significantly increasing the viscosity of the coating formulation, preferable with an additive that can be removed from the coated layer during drying or in a subsequent washing or decomposition step. Note that mobility of the CNT ropes in the dispersions can be made to happen above about 3,000 mg/liter, as the CNT ropes form a "gel" structure above this concentration by directly entangling with each other. The gel structure inhibits the kinetics of CNT particles size growth, that is, the growth of larger diameter ropes, which results in improved optoelectronic properties for the final film. However, to achieve similar stability in the intermediate concentration range (100 to 3,000 mg/liter), or in the low concentration range (<100 mg/liter), the viscosity of the liquid phase can be significantly increased (in the range of $10^1$ to $10^5$ cP). Not only do fugitive viscosity modifier stabilize the CNT dispersion, but they also make the continuous web coating process more robust (as a number of coating techniques prefer higher viscosity) by allowing deposition of thick wet layers that remain stabile during a drying process.

One embodiment on the invention is directed to a stable CNT dispersion. Stable CNT dispersions comprise a solution containing carbon nanotubes that are uniformly distributed though the solution that does not change (e.g. flocculate, aggregate into small masses which may be difficult or impossible to unaggregate) with the passage of time. Preferred time periods during which the solution remains stable include greater than 12 hours, 18 hours, 24 hours, 36 hours, 48 hours, 60 hours, three days, five days, a week or even longer. Furthermore, a stable CNT dispersion allows for removal of some or most of the solvent and or viscosity modifier present without allowing the fluid (e.g. wet) coating to flow. As the solvents and/or viscosity modifiers evaporate or decompose, said dispersion only becomes unstable immediately before the CNT ropes consolidate to form a network of ropes. Stable CNT dispersions may contain one or more fugitive viscosity modifiers. Preferred fugitive viscosity modifier function in multiple solvents and within a wide range of CNT concentrations. Concentrations of CNTs within the dispersion range from less than 1 mg/L to greater than 5,000 mg/L. Preferred ranges at which the fugitive viscosity modifiers operate are from 1 mg/L to 100 mg/L, from 50 mg/L to 2,000 mg/L, from 100 mg/L to 1,000 mg/L, from 10 mg/L to 3,000 mg/L, from 100 mg/L to 3,000 mg/L, from 1,000 mg/L to 3,000 mg/L, from 2,000 mg/L to 5,000 mg/L, and from 2,000 mg/L to 4,000 mg/L.

A fugitive viscosity modifier is a material (organic or inorganic) that is added to a solvent and imparts an increased or decreased viscosity (e.g. viscosity builders, viscosity modifiers, viscosity reducers) to the solution (as determined from the desired viscosity) and, preferably, dispersion stability, that can be eliminated after or during removal of solvent. Removal of the modifier and/or the solvent is preferably performed by thermal decomposition, evaporation, sublimation, decomposition, ablation, washed out of the film with one or more solvents, or removed through other conventional processes, or any combination thereof. The amount of modifier for a particular CNT solution will vary widely, but can be easily determined by those skilled in the art from, for example, the molecular weight of the modifier (e.g. especially with polymers), the functionality of the modifier (e.g. number of functional groups present), nitrogen content, and/or pH. A number of specific and generic types of fugitive viscosity modifiers are disclosed in Tables 1 and 2, and also includes clays, thickeners, proteins, gelling agents, stiffening agents, surfactants, suspending agents, fillers, starches, solubilizers, lubricants, excipients, chelating agents, and combinations of any (e.g. see Handbook of Industrial Chemical Additives, Second Edition, compiled by Michael and Irene Ash, Published by John Wiley & Sons Inc., 2000 {ISBN 1-890595-06-3}, which is incorporated entirely by reference).

Another embodiment of the invention is directed to compositions of the invention that contain non-fugitive viscosity modifiers. Such modifiers may be utilized when it is not necessary to remove the modifier when forming films or coatings.

Formulations:

More Viscous Solvents, than IPA/Water, as Additives or as the Primary Solvent

At least one advantage of using solvents is that they evaporate during drying and are not present in the carbon nanotube film structure. Useful solvents include, but are not limited to: 1,3 butanediol (130 cP); glycerin (1500 cP); ethylene glycol; polyethylene glycol; CELLUSOLVE™ and combinations thereof. Additional solvent that are useful with this invention are well-known to those of ordinary skill in the art and commercially available. Since viscosity is temperature dependent, cooling the solvent system sufficiently increases the viscosity in most solvents.

Thickening Agents with Low Viscosity Solvents like Water

Functional groups on the carbon nanotubes loosely bond or entangle to form the carbon nanotube ropes (see FIG. 4) in dispersions as the CNTs consolidate during drying. High molecular weight materials may be used to significantly increase the viscosity, but at concentrations that do not affect the CNT network formation or R/T properties of the carbon nanotube film. Preferred materials include, but are not limited to, those listed in Tables 1 and 2.

To be compatible with the most common optical films (e.g. PET and polycarbonate), the more viscous solvent(s) or the thickening agents can preferably be fugitive at relatively low temperatures (below about 150° C.) or can be rinsed away by a suitable solvent (leaving behind the CNT film). An ideal additive is one which increases viscosity, but can be removed entirely or nearly entirely (i.e. to the degree necessary for the purpose of the application), so as at low temperature after coating, leaving the carbon nanotubes on the surface to form a network of ropes. Preferably, compounds that increase viscosity of the CNT-containing solution is capable of decomposing into gases at temperatures below that of the coated substrate which thereby allows formation of the CNT conductive network without hindrances of the network formation. Due to the high thermal stability of CNT in air, many polymeric and organic compounds will decompose before the CNT layer is damaged. A wide variety of compounds can be used to increase viscosity of the CNT dispersion and thereafter can be removed entirely from the CNT layer. Alternatively, one or more thickening agents may be added at such low concentration so as to not excessively impact the final film properties.

Subsequent to coating, drying to remove solvent and viscosity modifiers, the CNT film can be "further assembled" by exposing the film to an appropriate amount of solvent (e.g., water) via dipping or misting. This further assembly is imparted by the temporary enhancement of CNT mobility resulting from the wetting of the CNT network. The CNT film is allowed to sufficiently assembled again (or consolidated) by van der Waals forces as it dries a second time. This second rewetting and drying step is advantageous whenever the initial drying rate is very fast or after removal of the viscosity modifiers during the initial drying or decomposition step. Subsequently, a polymeric topcoat may be applied to lock-in this structure and provide additional environmental protection to the CNT layer.

Figure 1:
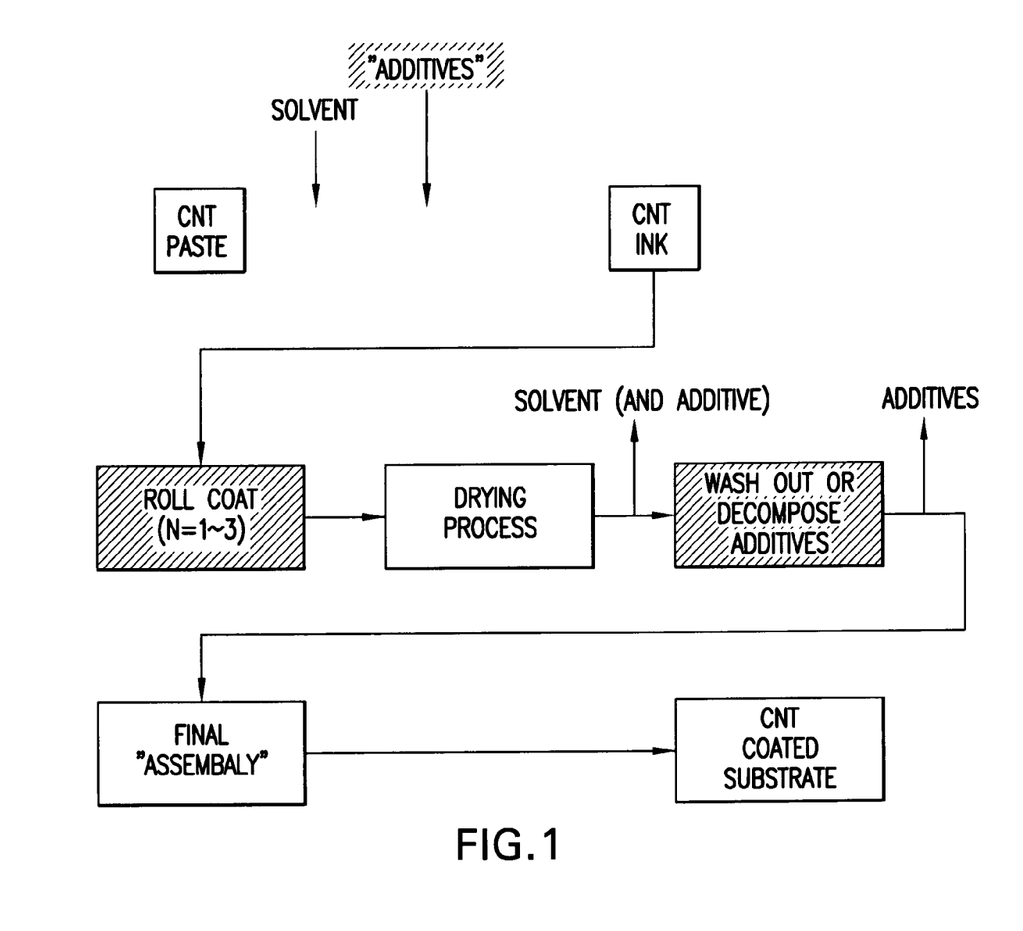
FIG. 1 A flow chart of the process of one embodiment of the invention.
Figure 2:
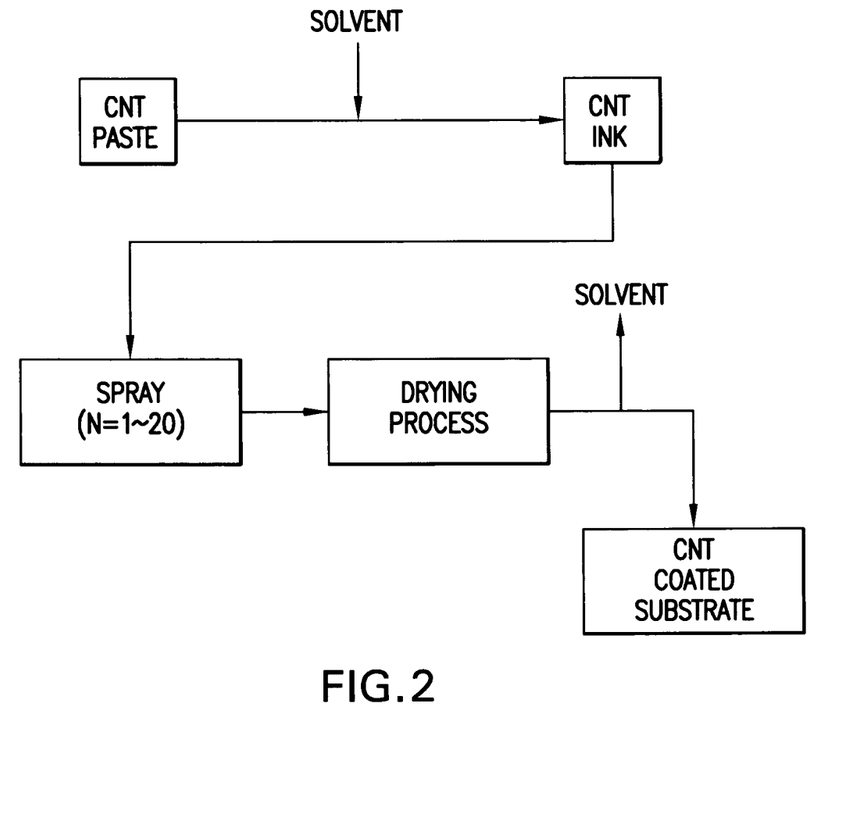
FIG. 2 The process of FIG. 1 contrasted with a spray coating process.
Figure 3:
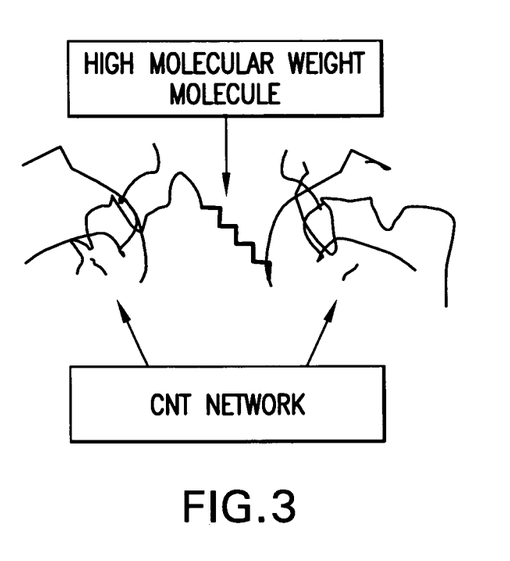
FIG. 3 Schematic depiction of the conceptual theory.

Although the process shown in FIG. 1 is complex, it allows for a wider range of products to be manufactured at much better process economics than spray coating.

The following examples illustrate embodiments of the invention, but should not be viewed as limiting the scope of the invention.

EXAMPLES

Base Assumptions
  Paste concentration=1900-3500 ppm
  Ink concentration=10-50 ppm
  Target Concentration=600-1000 ppm
  Viscosity=100 cP
  Sheet Resistance (Rs)=1500-10,000 Ohm/sq. with implied transparency (90%)
  Increase viscosity without degrading R/T performance.
Solutions:
Using more Viscous Solvents than IPA(/Water)
  1,3 Butanediol (130 cP)
  Glycerin (1500 cP)
  Cellusolve (methyl, butyl)
Utilizing One or More of the Viscosity Increasing Agents Listed in Table 3

Example

Viscosity Increase in CNT Dispersion using Xanthan Gum

Two (2) experimental trials applying arc produced single walled carbon nanotube (SWCnT) soot coatings to glass substrates to show that increasing the viscosity through known thickening agents can provide CNT dispersion stability and be removed without significantly degrading the electrical sheet resistance and light transmittance (R/T) performance. Purchased SWNTs are purified by process steps including acid reflux, water rinsing, centrifuge and microfiltration. Then, the purified SWNTs are mixed into a 3:1 solution of isopropyl alcohol (IPA) and water to form a carbon nanotube coating solution. (The soot, containing approximately 50-60% carbon nanotubes, was purified by refluxing in 3M nitric acid solution for 18 hours at 145±15° C., and then washed, centrifuged and filtered). The purified mixture produces an ink solution containing >99% single walled carbon nanotubes at a concentration of 0.059 g/L (ink solution "A").

The coating formulations applied in the trials performed utilized a #16 Meyer rod. After application and subsequent processing steps, the sheet resistance (R) of the CNT coating was measured using a Loresta ESP Four-Point probe and the light transmittance (T) measured using a spectrophotometer at wavelength 550 nm.

First Trial (FIG. 4):
2 ml 0.5% Xanthan Gum Stock Solution
4 ml Ink Solution "A"-0.059 g/l.
Glass substrates 150 mm×200 mm
16 Meyer Rod Approximately 0.15 wt % Xanthan Gum solution was made by dispersing 2 ml of 0.5% Xanthan Gum Stock Solution in 4 ml of Ink Solution "A". The xanthan gum solution was distributed along the application interface of the glass substrate and #16 Meyer rod. The Meyer rod was drawn down the length of the glass substrate (200 mm). The coating was applied on a 75° C. hot plate, allow to air dry for 1 min, then heated using a heated air dryer (130° C.). The sheet resistance and percent transmittance (R/T performance) was measured after the following steps:
  1. Application using #16 Meyer rod on 75° C. hot plate
  2. Rinsed in D.I. Water for 1 minute.
  3. Baked for 30 minutes at 300° C.
  4. Rinsed in D.I. Water for 1 minute.

Figure 4:
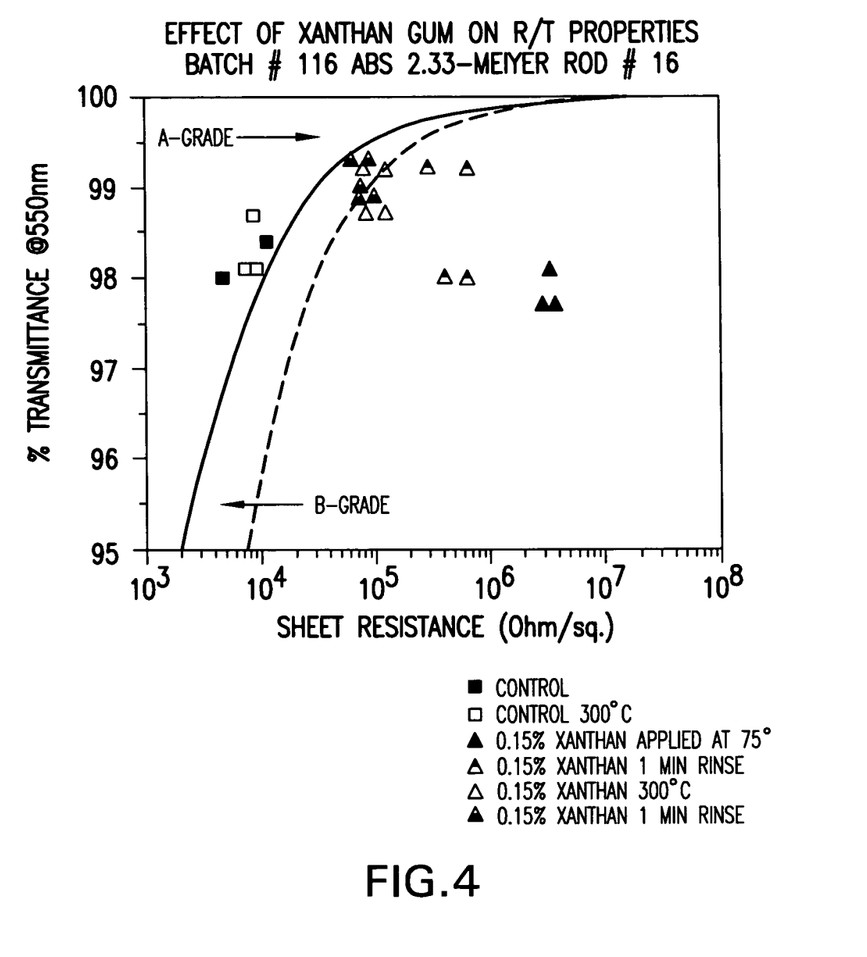
FIG. 4 Effect of xanthan gum on R/T properties (first trial).

The graph in FIG. 4 shows the impact each step has on the sheet resistance and light transmittance. The dotted lines on the graph represent the theoretical performance (based on empirical data) of CNT coatings on glass substrates.
Conclusions:
  No significant effect on R/T performance on control after heating at 300° C. for 30 minutes.
  Maintained CNT dispersion during application by remaining on R/T curves.
  Resistance is lower than control indicating there is loss of CNT'S, due to rinsing
  No significant improvement after $2^{nd}$ rinse indicating a good network structure was obtained after the initial dry stage.

Figure 5:
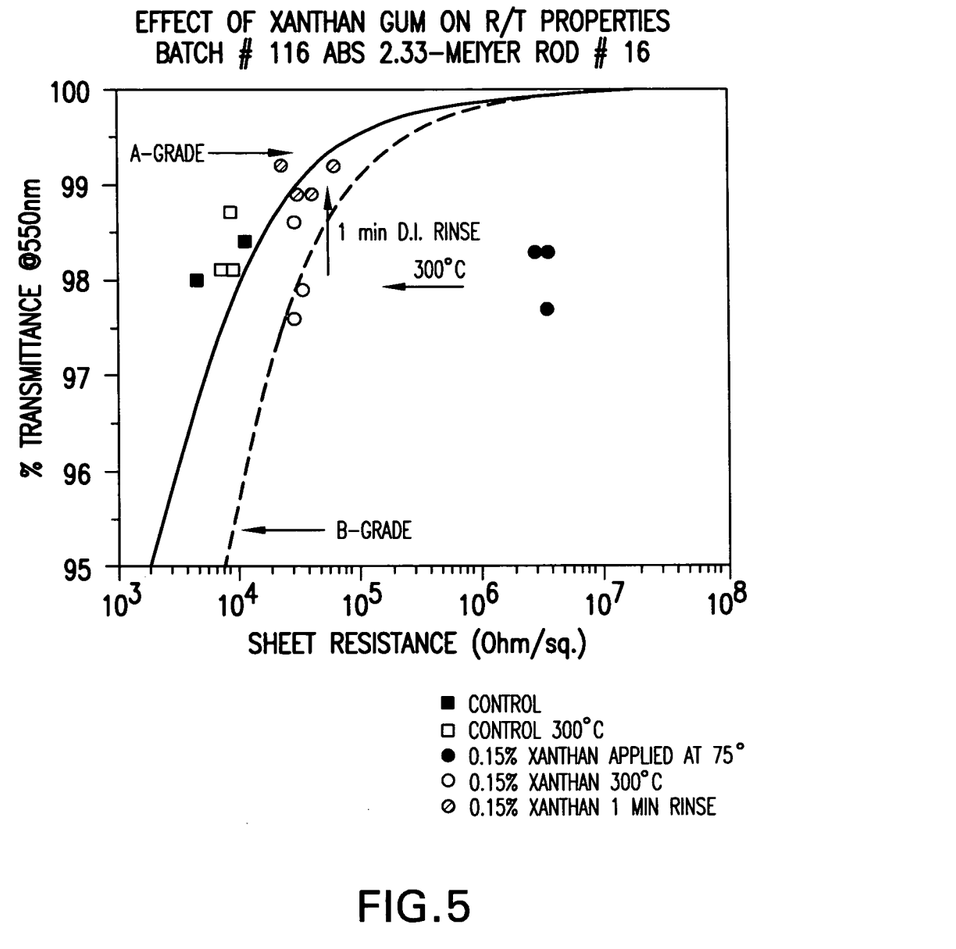
FIG. 5 Effect of xanthan gum on R/T properties (second trial).

Second Trial:
Same experiment as above except there was only a rinse after the 300° C. bake for 30 minutes (see FIG. 5). The following process, measuring the R/T performance after each step:
  1. Application using #16 Meyer rod on 75° C. hot plate.
  2. Baked for 30 minutes at 300° C.
  3. Rinsed in D.I. Water for 1 minute.
Conclusions:
  No significant effect on R/T performance on control after heating at 300° C. for 30 minutes.
  Resistance is lower than control indicating there is loss of CNT'S, but not as much as previous process.
  No significant improvement after $2^{nd}$ rinse.

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. It is intended that the specification and examples be considered exemplary only.

TABLE 1

| Thickener | Rinse (if necessary) |
|---|---|
| Water Soluble Gums (e.g. Xanthan) | Water |
| Polyacrylics | pH rinse |
| Polyethylene Oxide | Leave behind* |
| Silica (CABOSIL ™) | Water |
| Methyl Celloluse (METHOCEL ™) | Water |
| Photosensitive Acrylics (Positive Photoresist) | UV/NaHCO3 |
| Polyurethane additive (Rheomax 275) | Leave behind* |
| Polyvinyl alcohol | Water |
| Gelatin | Water |

TABLE 2

| Example Functional Categories |
|---|
| abrasives |
| absorbents |
| accelerators |
| acidulants |
| activators |
| adhesion promotors |
| adsorbents |
| algicides |

TABLE 2-continued

Example Functional Categories alkaline agents
antiblocking agents
anticaking agents
anticoagulants
anticracking agents
anticratering agents
anticrocking agents
antidegradants
antiflexcracking agents
antiflooding agents
antifog agents
antifoulants
antifreeze agents
antifrosting agents
antigelling agents
antimicrobials
antioxidants
antiozonants
antipopping agents.
antisagging agents
antisettling agents
antishrink agents
antiskinning agents
antislip agents
antistats
antistripping agents
aromatics/fragrances
binders bleaching agents
blocking agents
blowing agents
bodying agents
bonding agents
buffers
bulking agents
catalysts
chain extenders
chelating agents
chlorinating agents
clarifiers/filter aids
cloud point depressants
clouding agents
coagulation agents
coalescing agents
combustion promoters
compatibilizers
complexing agents
conditioners
cooling agents
corrosion inhibitors
coupling agents
creaming agents
crosslinking agents
crystal inhibitors
curing agents
deactivators
dedusters
dechlorinating agents
deflocculants
defluorination agents
defluxing agents
de-icing agents
deliming agents
demulsifiers
deodorizers
descaling agents
desizing agents
detackifiers
dewatering agents
dewaxing agents
dewebbers/antiwebbers
digestants/degradants
diluents
disinfectants/sanitizers
driers
dyeing assistants
dyes/colorants/pigments

TABLE 2-continued

Example Functional Categories emollients
enzymes
extenders
extraction aids
extreme pressure additives
fermentation aids
fibers fillers
film-formers
firming agents
fixatives
flame retardants
flatting agents
flocculants
flotation agents
flow control agents
fluorination chemicals
frothers
fungicides
gelling agents
gloss aids/sheen aids
gloss inhibitors
grinding aids
hand modifiers
hardeners
herbicides
homogenizers
humectants
hydrophobing agents
hydrotropes
impact modifiers
initiators
leveling agents
lubricants
marproofing agents
matte agents
melting point modifiers
mercerizing agents
metal passivators
migration inhibitors
mildewcides
moisture barriers/regulators
mordants neutralizers
nucleating agents
opacifiers
optical brighteners
oxidizing agents
oxygen scavengers
pearlescents
penetrants/saturants
peptizing agents
pH adjusters
photosensitizers
pickling agents
plasticizers/flexibilizers
polymer, resin and latex modifiers
pour pt. depressants
preservatives
printing assistants
processing aids
propellants/aerosols.
protective colloids
reclaiming agents
reducing agents
refatting agents
refrigerants
reinforcing agents
release agents
scale inhibitors
scorch retarders
sequestrants
short stops
sizing agents
slimicides
slip agents
sludge conditioners TABLE 2-continued Example Functional Categories smoke suppressants
softeners
solvents
spinning oils
spreading agents
stabilizers
sticking agents
stiffeners
substantivity agents
superfatting agents
surface finishing
agents
synergists
tackifiers
tanning agents
terminators
uv absorbers
vehicles/carriers
viscosity builders
viscosity modifiers
viscosity reducers
vulcanizing agents
water repellents

TABLE 3

| Thickener | Rinse (if necessary) |
| --- | --- |
| Water Soluble Gums (i.e. Xanthan) | Water |
| Polyacrylics | pH rinse |
| Ultra High Molecular Weight Polyethylene Oxide | Water |
| High Molecular Weight Binder (<10%) | |
| Silica (Cabosil) | Water |
| Methyl Celloluse (Methocel) | Water |
| Photosensitive Acrylics (Positive Photoresist) | UV/NaHCO3 |
| Polyurethane additive (Rheomax 275) | |
| Catalyzed Thermal Degradation | |
| Emulsions | |

The invention claimed is:

1. A stable dispersion comprising:
   a solvent;
   carbon nanotubes uniformly distributed within the solvent, wherein said carbon nanotubes do not flocculate within a period of time of greater than 12 hours; and
   at least one fugitive viscosity modifier added to the solvent, wherein the fugitive viscosity modifier is selected from the group consisting of polyacrylics, polyethylene oxide, silica, photosensitive acrylics, polyvinyl alcohol, and combinations thereof.

2. The dispersion of claim 1, wherein the concentration of carbon nanotubes is between 10 mg/L and 3,000 mg/L.

3. The dispersion of claim 1, wherein the fugitive viscosity modifier increases or decreases viscosity of the dispersion.

4. The dispersion of claim 3, wherein the increased or decreased viscosity is between $10^0$ and $10^5$ cP.

5. The dispersion of claim 1, wherein the solvent is selected from the group consisting of water, alcohol, 1,3 butanediol, glycerin, ethylene glycol, polyethylene glycol, glycol, gelatin, and combinations thereof.

6. The dispersion of claim 1, wherein the period of time is greater than 24 hours.

7. The dispersion of claim 3, wherein the fugitive viscosity modifier increases viscosity of the dispersion and can be entirely or nearly entirely removed at a temperature that does not adversely affect molecular structure of the carbon nanotubes.

8. The dispersion of claim 7, wherein the molecular structure of the carbon nanotubes comprises an electrically conductive network upon removal of the solvent.

9. The dispersion of claim 7, wherein the temperature is less than 150° C.

10. The dispersion of claim 1, wherein the carbon nanotubes are single-walled, double-walled or multi-walled carbon nanotubes.

* * * * *